United States Patent
Warren

[11] Patent Number: 5,940,724
[45] Date of Patent: Aug. 17, 1999

[54] METHOD FOR EXTENDED ION IMPLANTER SOURCE LIFETIME

[75] Inventor: Ronald A. Warren, Essex Junction, Vt.

[73] Assignee: International Business Machines Corporation, Armonk, N.Y.

[21] Appl. No.: 08/845,970

[22] Filed: Apr. 30, 1997

[51] Int. Cl.⁶ .................................................. H01L 21/425
[52] U.S. Cl. .......................................... 438/514; 438/919
[58] Field of Search ..................... 438/514, 515, 438/516, 919

[56] References Cited

U.S. PATENT DOCUMENTS

| | | |
|---|---|---|
| 4,670,064 | 6/1987 | Schachameyer et al. ............... 438/514 |
| 5,235,451 | 8/1993 | Bryan ......................................... 359/88 |
| 5,262,652 | 11/1993 | Bright et al. .......................... 250/492.2 |
| 5,354,698 | 10/1994 | Cathey et al. ........................... 438/514 |
| 5,466,942 | 11/1995 | Sakai et al. .......................... 250/492.2 |

*Primary Examiner*—Chandra Chaudhari
*Attorney, Agent, or Firm*—Pollock, Vande Sande & Amernick; Eugene I. Shkurko

[57] ABSTRACT

The life of a source filament in an ion implantation tool is extended by providing in the ion implantation tool both an ion source reactant gas for providing a source of ion species to be implanted and a counteracting gas to counter the chemical transport from or to the filament, depending upon the reaction that occurs between the ion source gas ions and the source filament.

17 Claims, 1 Drawing Sheet

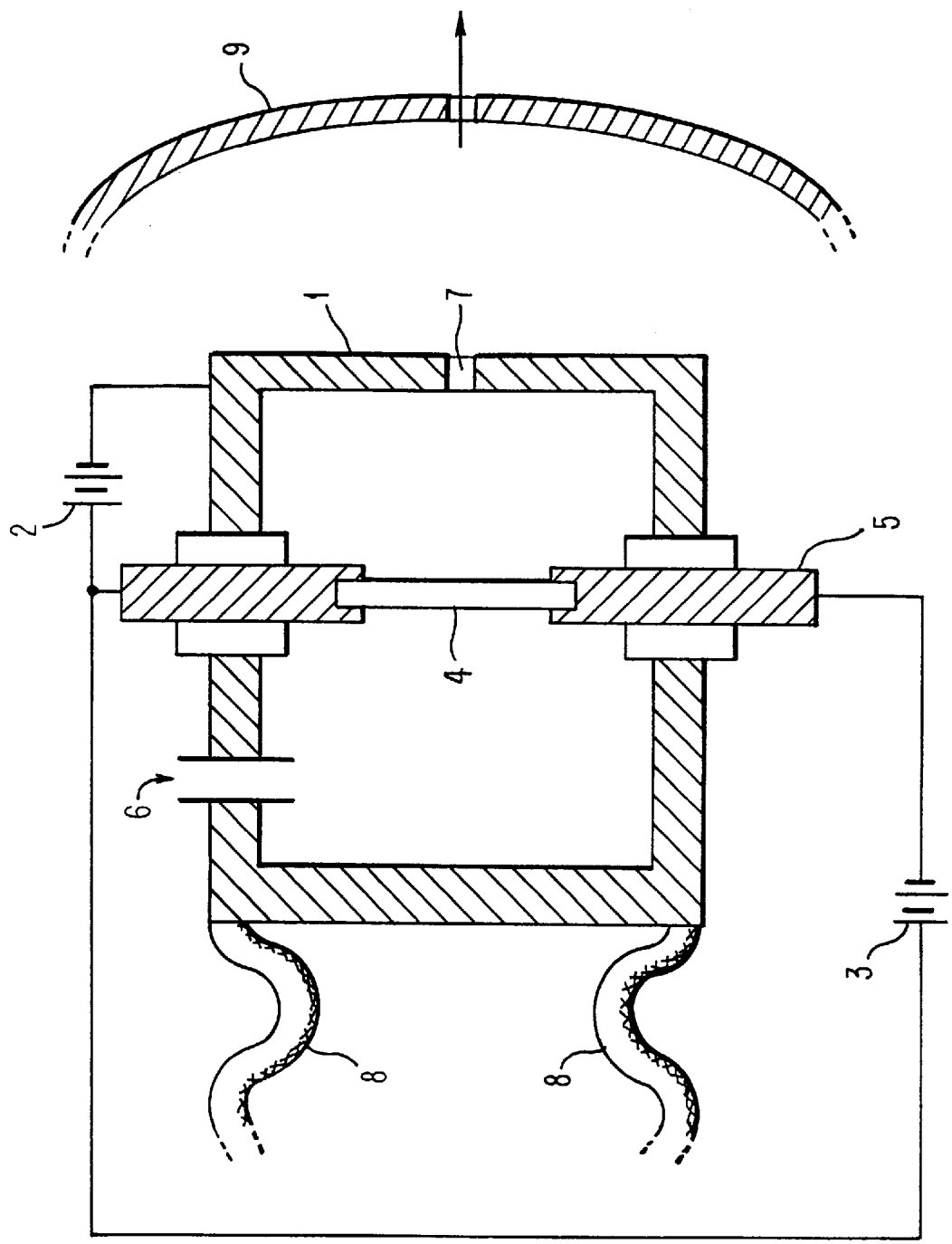

METHOD FOR EXTENDED ION IMPLANTER SOURCE LIFETIME

DESCRIPTION

TECHNICAL FIELD

The present invention is concerned with an improved method for implanting preselected ions into a target. In particular, the present invention is concerned with implanting preselected ions into a target, resulting in extending the life of the ion implanter source or filament. More particularly, the present invention is concerned with countering the chemical or physical transport from or to the filament.

BACKGROUND OF THE INVENTION

In manufacturing semiconductor devices, the semiconductor wafer is modified at various regions by diffusing or implanting positive or negative ions referred to as dopants, such as boron, phosphoric, arsenic, antimony and the like into the body of the semiconductor wafer to thereby produce regions having varying conductivity.

Various ion implanters are known, using several types of ion sources. An ion beam of a preselected chemical species is generated by means of a current applied to a filament within an ion source chamber, also fitted with a power supply, ion precursor gas feeds and controls. The ions are extracted through an aperture in the ion source chamber by means of a potential between the source chamber, which is positive, and extraction means. Allied acceleration systems, a magnetic analysis stage that separates the desired ion from unwanted ions on the basis of mass/charge and focuses the ion beam, and a post accelerated stage and insures delivery of the required ions at the required beam current level to the target or substrate wafer to be implanted, complete the system.

The most common type of ion source used commercially is known as a Freeman source. In the Freeman source, the filament, or cathode is a straight rod, typically made of tungsten or a tungsten alloy or other known materials, that is passed into an arc chamber, whose walls form the anode.

The arc chamber itself is fitted with an exit aperture, with means for feeding in the gaseous precursors for the desired ions; with vacuum means; with means for heating the cathode to about 2000 K up to about 2800 K so that it will emit electrons; with a magnet that applies a magnetic field parallel to the filament to increase probability of collision for ionized species; and with a power source connecting the filament to the arc chamber.

The ion implantation process begins with the evolution and extraction of ion species from a source chamber. Both solid sources (with vaporizers) and gaseous sources, such as $BF_3$, $AsH_3$, $PH_3$, $GeH_4$, $SiC_{,4}$ and $GeF_4$ are used. The source materials are passed over the filament, which is at elevated temperatures, and which decomposes the source material into the desired ionized species, that is, the compound that will be implanted, along with ions from the remainder of the source material compound. For example, $AsH_3$ decomposes into As, H, and $AsH_x$ species. $BF_3$ decomposes into B, $BF_2$, F and other $BF_x$ compounds.

The problem caused by the F (fluorine) is that the F ions etch away tungsten from the source cavity, forming gaseous $WF_6$. This material then diff-uses to, and decomposes on the surface of the filament. This results in metallic tungsten being deposited on the hot filament, fluorine ions being liberated. This metallic tungsten deposition on the filament causes the filament to increase in cross-sectional area, resulting in decreased filament resistance. The power input to the source must remain constant. If the filament resistance decreases, then the filament current must be increased to maintain the required constant power. Ultimately the implant power supplies cannot supply sufficient current to maintain this required power, and the source must be rebuilt with a new filament.

There is a related problem for non-fluorinated source materials, where tungsten is sputtered off of the filament, decreasing its cross sectional area. The filament will soon be too thin and will break, again resulting in the need to rebuild the source with a new filament. This sputtered-away tungsten also causes a problem in that it will deposit on the surface of the insulators that electrically isolate the various parts of the implant source. This will cause premature insulator failure and again result in the need to rebuild the ion source.

The time spent doing these source changes is a major cost-of-ownership driver for ion implanters. In some cases, such as if only $GeF_4$ were run on a tool, the source must be replaced every 30 hours. Changing the source takes a significant amount of maintenance labor and can take up to 4–6 hours of tool down-time to complete.

One of the common methods used to extend source lifetimes is to alternate implant species. For example, a fluorinated source feed material, such as $BF_3$ or $GeF_4$, will be run for 4 hours, then a non-fluorinated species, such as $AsH_3$ or $PH_3$, will be run for 4 hours, then the tool will be switched back again to the fluorinated source material. The filament cross-sectional area will increase with the $GeF_4$, then decrease with the $AsH_3$, then increase again with fluorinated source material. The fluorine also helps to improve source life by scavenging sputtered away tungsten and causing it to be redeposited on the filament. This cycling results in increased source lifetime and improves overall implanter throughput. The problem with this is that it is logistically very complex to execute. There are also many instances where the daily production schedule does not support this optimal cycling sequence, making it impossible or impractical to run these alternating species. Furthermore, switching between source materials takes time and reduces the amount of time that the tool is available to run production.

It would therefore be desirable to provide a process for ion implanting dopants that extends the lifetime of the filament without a concomitant loss in throughput of the ion implanter apparatus.

SUMMARY OF INVENTION

The present invention is concerned with a process for implanting ions into a semiconductor wafer which improves or extends the life of the filament in the system. Moreover, the process of the present invention provides for improved life of the ion implanter source without a concomitant loss in throughput of the apparatus.

More particularly, the present invention is concerned with a method for implanting ion species in a semiconductor wafer from a source chamber which comprises providing an ion source reactant gas for providing a source of ion species to be implanted; providing a counteracting gas to counter the chemical transport from or to the filament in the source chamber depending on the reaction between the ion source gas ions and the filament to compensate for said reaction; introducing both the ion source reactant and counteracting gas at substantially the same time in said source chamber, so that said counteracting gas compensates for removal or deposition of material on said filament; separating the ions to be implanted from other ions present and then directing the ions to be implanted from the source chamber to the semiconductor wafer.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

SUMMARY OF DRAWING

The FIGURE is a schematic diagram of apparatus suitable for carrying out the process of the present invention.

DESCRIPTION OF BEST AND VARIOUS MODES FOR CARRYING OUT INVENTION

According to the present invention, multiple gases or source materials are introduced into the source chamber 1 (see FIGURE) at substantially the same time and in controlled relative quantities so as to generate the desired ions to be implanted and to compensate for the removal from or deposition of material on ion implanter source or filament 4. More particularly a "dummy" source material is introduced along with the primary source material in order to counteract the effect of the primary source material on the filament. The filament 4 is preferably a tungsten-containing filament, either tungsten or a tungsten alloy containing at least 50% tungsten. By way of example, when the primary source material is a fluorine containing material such as $BF_3$, the fluorine ion tends to react with the source chamber will forming $WF_6$. This $WF_6$ material is then transported to the filament, where it decomposes and deposits metallic tungsten on the filament. In such a case, either an inert gas such as argon, xenon or krypton, with high sputtering yield or a material containing a chemical species that forms volatile compounds with hot tungsten, such as arsine, phosphine or hydrogen, would be introduced into the source chamber to counteract the filament deposition process. The high sputter-yield inert gas, coupled with a high arc current such as up to about 20 amps and applied bias voltage of about 5–10 volts, increases the sputter rate of tungsten away from the filament. Introducing a reactant that forms volatile high-temperature tungsten compounds has the same result. By properly proportioning the fluorine containing gas, the high sputter yield inert gas, and the arc current, simultaneous erosion and deposition of tungsten onto the filament would take place, resulting in little or no net change in filament size. In a similar manner, a fluorine containing gas, such as $CF_4$, $BF_3$, $F_2$, $NF_3$, $GeF_4$, $SiF_4$ or $SF_6$ could be introduced into the source chamber in a controlled manner when using a non-fluorinated primary source material. In this case the fluorine would scavenge tungsten which had been sputtered away from the filament, re-depositing it on the filament.

In the case of a reaction chamber that did not include tungsten on its walls (such as when Mo is used as a construction material), a sacrificial tungsten block could be provided in the chamber to supply the source of tungsten needed to compensate for the tungsten erosion of the filament and tungsten lost from the source cavity to the rest of the implanter apparatus.

The preferred "dummy" source materials are gaseous species such as $CF_4$, $NF_3$, Xe, Ar, Kr, $H_2$, $BF_3$ that do not contain a low-vapor pressure subcomponent. This prevents source life degradation that would result from excessive build up of nonvolatile byproducts.

The ions generated from the "dummy" species can be excluded from being implanted into the semiconductor wafer or product by the mass/charge analyzer component that is present in the implanter. Such is typically a magnetic analyzer that separates the desired ions from any of the unwanted ions on the basis of mass/charge and focuses the ion beam. The arc current can be changed to alter the erosion rate. In particular, an increase in arc current causes a commensurate increase in sputtering rate and therefore erosion increases.

A further potential advantage of the additional fluorine is that such may also reduce the possibility for depositing tungsten on the installators thereby causing arcing or shorts. In particular, the filament is electrically insulated from the arc chamber using electrical insulators. These insulators are typically made of high temperature ceramic materials, such as alumina or boron nitride, that will withstand high temperatures and the corrosion atmosphere generated by the precursor gas species. Even a very thin conductive coating short circuits the arc supply and interferes with the stability of the ion beam emitted from the source chamber, eventually rendering it unusable. At this point, the chamber must be cleaned and the insulators and filament reconditioned or replaced. Similar electrical insulators are employed to insulate the source from the extraction electrode and the source from the body of the tool.

According to a preferred aspect of the present invention, the flow of the "dummy" source gas is controlled through a feedback loop, utilizing source parameters monitored on the implanter. The resistance of the source filament is calculated from the filament voltage and current. In turn, the "dummy" source gas flow is adjusted based on the resistance of the filament.

The present invention results in extending the life of the source filament without having to fine-tune the product loading on the implanters. In addition, the present invention results in greater tool throughput and lower operating costs due to decreased maintenance requirements.

The FIGURE is a schematic diagram of apparatus suitable for carrying out the invention. In particular numeral 1 refers to the ion implant source arc chamber, with 2 representing the arc power source and 3 the filament power source. The numeral 4 represents the filament and 5 its isolation. The gases can be introduced through gas feed 6. Also included is an arc slit 7, isolation bushing 8 and extraction electrode 9. The arrow represents the direction of the ion beam.

In this disclosure, there are shown and described only the preferred embodiments of the invention, but as aforementioned, it is to be understood that the invention is capable of use in various other combinations and environments and is capable of changes or modifications within the scope of the inventive concept as expressed herein.

What is claimed is:

1. A method for implanting ions into a target which comprises:

a) providing an ion source chamber having a filament for causing evolution of the ions to be implanted;

b) providing an ion source reactant gas for providing a source of the ion species to be implanted;

c) providing a counteracting gas to counter the chemical transport from or to the filament depending on the reaction between the ion source gas ions and the filament and to compensate for said reaction;

d) introducing the ion source reactant and counteracting gas into the ion source chamber at substantially the same time wherein said reactant forms ions to compensate for removal or deposition of material on said filament; and e) extracting the ions to be implanted from said ion source chamber and directing them to said target.

2. The method of claim 1 wherein said filament is a tungsten-containing filament.

3. The method of claim 1 wherein said ion source chamber contains walls made of tungsten containing material.

4. The method of claim 1 wherein said ion source chamber contains walls constructed of a metal other than tungsten containing material and wherein said ion source chamber further includes a sacrificial source of a tungsten containing material.

5. The method of claim 1 wherein said ion source reactant gas is a fluoride or hydride.

6. The method of claim 5 wherein when said ion source reactant gas is a fluoride, said counteracting gas contains hydrogen, and when said ion source reacting gas does not contain fluorine, said counteracting gas contains fluorine.

7. The method of claim 1 wherein said target is a semiconductor wafer.

8. The method of claim 1 wherein said ion source reactant gas is at least one member selected from the group consisting of $BF_3$ and $GeF_4$.

9. The method of claim 8 wherein said counteracting gas is at least one member selected from the group consisting of arsine, phosphine and $H_2$.

10. The method of claim 1 wherein said counteracting gas is at least one member selected from the group consisting of arsine, phosphine and $H_2$.

11. The method of claim 1 wherein said ion source reactant gas is at least one member selected from the group consisting of arsine and phosphine.

12. The method of claim 11 wherein said counteracting gas is at least one member selected from the group consisting of $BF_3$, $NF_3$, $CF_4$, $F_2$, $GeF_4$, $SiF_4$ and $SF_6$.

13. The method of claim 1 wherein said counteracting gas compensates for deposition of material in said filament by sputtering deposited material from said filament.

14. The method of claim 13 wherein said counteracting gas is an inert gas.

15. The method of claim 14 wherein said inert gas is selected from the group consisting of argon, xenon and krypton.

16. The method of claim 2 wherein the tungsten-containing filament is tungsten or a tungsten alloy containing at least 50% tungsten.

17. The method of claim 1 being carried out employing an arc current of up to about 20 amps and an applied bias voltage of about 5–10 volts.

* * * * *